United States Patent [19]

Finicle

[11] Patent Number: 5,158,750
[45] Date of Patent: Oct. 27, 1992

[54] BORON NITRIDE CRUCIBLE

[75] Inventor: Robert L. Finicle, Bay Village, Ohio

[73] Assignee: Praxair S.T. Technology, Inc., Danbury, Conn.

[21] Appl. No.: 750,296

[22] Filed: Aug. 27, 1991

Related U.S. Application Data

[62] Division of Ser. No. 533,816, Jun. 6, 1990, Pat. No. 5,075,055.

[51] Int. Cl.$^5$ .............................................. B01L 3/04
[52] U.S. Cl. .................................... 422/102; 422/99; 422/248; 432/156; 432/264; 432/265
[58] Field of Search ......................... 422/99, 102, 248; 432/262–265, 156

[56]  References Cited

U.S. PATENT DOCUMENTS

| | | | |
|---|---|---|---|
| 1,475,650 | 11/1923 | Osborne | 432/264 |
| 1,709,729 | 4/1929 | Landgraf et al. | 432/264 |
| 1,721,994 | 7/1929 | Greenslade et al. | 432/264 |
| 3,345,059 | 10/1967 | Swindt | 432/264 |
| 3,986,822 | 10/1976 | Lashway | 432/264 |
| 4,058,579 | 11/1977 | Lashway | 264/81 |
| 4,090,851 | 5/1978 | Berkman et al. | 432/265 |
| 4,264,803 | 4/1981 | Shinko | 219/275 |
| 4,446,357 | 5/1984 | Barshter | 432/264 |
| 4,596,700 | 6/1986 | Tada et al. | 432/265 |
| 4,613,306 | 9/1986 | Bauer et al. | 432/264 |
| 4,773,852 | 9/1988 | Tanji et al. | 432/263 |

FOREIGN PATENT DOCUMENTS 0866381  9/1981  U.S.S.R. .

OTHER PUBLICATIONS

Price List Boralloy ® Pyrolytic Boron Nitride High Purity Crucibles-Boats-Dishes, Catalog Section H-8770, pp. 1–2, Jan. 18, 1988, Union Carbide Coatings Service Corporation, Advanced Ceramics, Cleveland, Ohio.
"Boralectric ™ Boralloy ® Pyrolytic Boron Nitride (PBN)/Pyrolytic Graphite (PG) Resistance Heating Elements, Union Carbide Coatings Service Corporation", Advanced Ceramics, sales literature.
Boralloy ® Pyrolytic Boron Nitride, Union Carbide Corporation, pp. 1–19 sales literature, 1987.
Price List Boralloy ® Pyrolytic Boron Nitride Molecular Beam Epitaxy Crucibles, Catalog Section H-8762, Jan. 18, 1988, pp. 1–2, Union Carbide Coatings Service Corporation, Advanced Ceramics, Cleveland, Ohio.

Primary Examiner—James C. Housel
Assistant Examiner—Jan M. Ludlow
Attorney, Agent, or Firm—Cornelius F. O'Brien

[57]  ABSTRACT

A boron nitride crucible having a closed end, an open end, an internal surface and an external surface, and wherein at least a portion of the external surface, preferably proximate the open end of the crucible, has a duplex coating comprising an undercoat of pyrolytic graphite and a top coat of pyrolytic boron nitride. A process for making the boron nitride crucible is also disclosed.

9 Claims, 1 Drawing Sheet

BORON NITRIDE CRUCIBLE

This application is a division of Ser. No. 07/533,816, filed 06/06/90, now U.S. Pat. No. 5,075,055.

FIELD OF THE INVENTION

This invention relates to an improved boron nitride crucible primarily for use in coating substrates with epitaxial layers of a variety of elements or compounds in which at least the external surface of the crucible has an undercoat of pyrolytic graphite and a top coat of pyrolytic boron nitride to effectively eliminate undesirable low temperature areas on the crucible. The invention also relates to a process for producing the crucible.

BACKGROUND OF THE INVENTION

The structure, physical properties, purity, and chemical inertness of pyrolytic boron nitride (PBN) make it an attractive container material for elemental purification, compounding, and growth of semi-conductor crystals. Examples include containers for liquid-encapsulated Czochralski (LEC) and vertical gradient freeze (VGF) growth of GaAs and other III-V and II-VI compound single crystals, and source containers for deposition of metals and dopants at high temperatures and ultra-high vacuum by molecular beam epitaxy (MBE). Molecular beam epitaxy equipment is essentially a vacuum furnace in which semi-conductor substrates are coated with epitaxial layers of a variety of elements or compounds of aluminum, gallium, arsenic, indium and the like, by vaporization of these elements or compounds contained in a pyrolytic boron nitride crucible. During practice of the conventional molecular beam epitaxy process, defects in the epitaxial layer structure can occur. There are a variety of causes of such defects with one cause being due to the condensation on the relatively cool internal wall of the crucible generally adjacent to its open end, which results in droplets falling back into the melt. This can result in oval defect levels that can seriously limit the integrated circuit yield obtainable on molecular beam epitaxy wafers. Oval defects are surface dislocations oriented along the 110 crystalographic direction.

The precise control of the temperature uniformity or profile for external heated crucibles is a problem that can affect the quality of vapor deposited epitaxial layers. To correct for this non-uniform temperature profile of external heated crucibles, it has been suggested to apply a coating of pyrolytic graphite onto the external surface of the crucible adjacent the open end. Pyrolytic graphite is an anisotropic material that exhibits a thermal conductivity of 0.700° watt/m° C. in the "ab" plane and 3.5 watt/m° C. perpendicular to the "ab" plane. This proposal provided a solution to alleviate the Problem in which the section of the crucible, generally adjacent its open end, was relatively cooler than the remainder of the crucible. In addition, since the crucible is generally heated by external electrical heating means and since pyrolytic graphite is electrically conductive, there is always a problem that the heating means could contact the pyrolytic graphite coating and cause electrical shorting.

Pyrolytic boron nitride can be produced by various methods such as the method disclosed in U.S. Pat. No. 3,152,006 in which pyrolytic boron nitride is produced by the vapor-phase reaction of ammonia and boron halides, such as boron trichloride. By depositing the boron nitride produced in this manner upon a suitable mandrel, such as a graphite mandrel, a wide assortment of shapes can be produced.

It is an object of the present invention to provide an improved crucible suitable for external heating and having a more uniform or controlled temperature profile.

It is another object of the present invention to provide an improved crucible suitable for use in molecular beam epitaxy.

It is another object of the present invention to provide a process for producing an improved crucible suitable for being externally heated and having a more uniform or controlled temperature profile.

The foregoing and additional objects will become fully apparent from the following description and the accompanying drawings.

SUMMARY OF THE INVENTION

The invention relates to a process for producing a boron nitride crucible comprising the steps:

(a) preparing a mandrel having a shape of a desired crucible with an open end that is to be produced and depositing boron nitride upon said mandrel until the desired thickness of boron nitride is deposited on said mandrel;

(b) depositing graphite on the deposited boron nitride crucible at a selected area on its outer surface until a desired thickness of graphite is deposited on said selected area;

(c) depositing boron nitride upon said deposited graphite until a desired thickness of boron nitride is deposited; and (d) removing the boron nitride crucible from the mandrel, said crucible having a closed end, an open end, an internal surface and an external surface and wherein at least a portion of the external surface, preferably near the open end of the crucible, has an underlayer of pyrolytic graphite and a top layer of pyrolytic boron nitride.

If desired, in step (b) the area of the crucible that is not to be coated with the graphite could be masked in a conventional manner so that only the selected area of the crucible would be exposed for receiving the deposited graphite and deposited boron nitride. If the crucible is not masked then the deposited graphite and deposited boron nitride in the non-selected areas could be removed by conventional techniques such as by machining or abrasion.

Generally, the length of the deposited duplex coating should begin at the external surface near the open end of the crucible and extend the entire length of the crucible depending on the particular end use application. Preferably at least about ten percent of the length of the crucible should be coated with the duplex coating. For any length crucible, the length of the duplex coating could preferably be from about 10 to 80 percent of the overall length of the crucible.

As used herein, crucible shall also mean a boat or any other container which can be used in the art for various applications.

It has been found that in heating a pyrolytic boron nitride crucible to high temperatures of about 900° C. by use of surrounding resistance heaters in high vacuum effusion cells, the temperature differential at the open end of the crucible can be as much as 40° C. to 100° C. A thin layer of pyrolytic graphite on the exterior of the surface proximate the open end of the crucible can substantially reduce the temperature differential at this area in its relation to the temperature at the remaining surface of the crucible. This is because pyrolytic graphite typically exhibits a thermal conductivity of 700 watt/m° C. in the "ab" plane and 3.5 watt/m° C. in the "c" plane which is perpendicular to the "ab" plane. The thermal conductivity of pyrolytic graphite is much better than thermal conductivity of pyrolytic boron nitride which has a thermal conductivity of 60 watt/m° C. in the "ab" plane and 1.5 watt/m° C. in the "c" plane. Thus, pyrolytic graphite is necessary rather than an extra coating thickness of pyrolytic boron nitride to obtain a more uniform or controlled temperature profile for the crucible.

According to this invention, a layer of pyrolytic boron nitride on top of the pyrolytic graphite will (1) further reduce the temperature differential at the open end of the crucible, (2) electrically isolate the pyrolytic graphite layer from the surrounding resistance heater wires and (3) reduce the possibility for carbon contamination in products being produced using the crucible. Pyrolytic boron nitride can aid in reducing heat loss as a result of its lower "c" direction thermal conductivity and lower spectral emissivity than pyrolytic graphite. Other benefits of pyrolytic boron nitride are that it is an excellent dielectric material even at high temperatures and it is also highly impermeable.

For most applications the thickness of the undercoat layer of pyrolytic graphite should be from 0.001 to 0.100 inch thick, preferably from 0.001 to 0.010 inch thick. The thickness of the top coat of pyrolytic boron nitride should be from 0.002 to 0.040 inch thick, preferably from 0.004 to 0.010 inch thick.

To form a coating of pyrolytic graphite on a boron nitride crucible, a hydrocarbon gas is decomposed in the presence of the crucible at a pressure preferably less than atmospheric and within a temperature range of between about 1000° C. to 2100° C., preferably from about 1300° C. to 1800° C. The hydrocarbon gas may be diluted with an inert diluent gas such as helium, argon or nitrogen in a ratio of about 10 to 400 parts by volume diluent gas per part volume of the source gas.

The hydrocarbon gas may be any suitable alkane such as methane or propane or an aromatic such as benzene. The preferred hydrocarbon gas is methane.

To produce the crucibles of the present invention, the boron nitride is deposited upon a mandrel having the same shape as the desired crucible. The mandrel employed, of course, must be one which does not melt at the temperature at which the boron nitride is applied and which is inert to the boron halide and ammonia at such temperature. Generally, the mandrel employed is made of graphite.

Typically, the mandrel upon which the boron nitride boat is to be formed is mounted in a vapor deposition vacuum furnace and, after the furnace is heated to the desired temperature, he ammonia and boron halide gas, generally boron trichloride, are introduced into the reactor. The reaction between the ammonia and boron halide, and deposition of the boron nitride produced by this reaction, is typically effected at a temperature of from about 1450° C. to about 2300° C., and the reactor is accordingly maintained within this range. Preferably the temperature of the reactor is maintained between about 1800° C. and 2000° C.

The reactants are introduced into the reactor in vapor phase. Generally, at least 1 mole of ammonia is employed per mole of boron halide, with an excess of ammonia being preferred. Most preferably, from 2.5 to 3.5 moles of ammonia are employed per mole of boron halide, although even greater excesses can be employed if desired. The flow rate of the reactants through the reactor depends upon the specific design of the reactor and the size and shape of the mandrel upon which the boron nitride is to be deposited. Generally, flow rates of from about 0.2 standard cubic meter/hour to about 0.3 standard cubic meter/hour of boron halide per 1.5-2.5 cubic meters of furnace volume are suitable. If desired, an inert gas may be intermixed with the reactant gases.

After a suitable time, i.e., after the desired amount of boron nitride has been deposited on the mandrel, the flow of reactants into the reactor is interrupted and the reactor is cooled to room temperature. The pyrolytic boron nitride boat can then be removed from the mandrel.

In some applications it may be desirable to have a multi-walled crucible as described in U.S. Pat. No. 3,986,822. Specifically, the crucible is produced by depositing pyrolytic boron nitride upon a mandrel having the shape of the desired crucible at a temperature of from about 1850° C. to about 3100° C. until a first layer of boron nitride of suitable thickness has been produced, interrupting the deposition of boron nitride upon the mandrel and lowering the temperature to below 1750° C., and then depositing additional boron nitride upon the mandrel at a temperature of from about 1850° C. to about 2100° C. to produce a second outer layer of boron nitride having a thickness greater than that of the inner layer.

DESCRIPTION OF THE DRAWING

FIG. 1 shows a single walled pyrolytic boron nitride evaporating crucible 2 having an outward flange 4 at its open end. On a selected area of its exterior surface 6 is a layer of pyrolytic graphite 8 over which is deposited a layer of pyrolytic boron nitride 10. As stated above, the duplex layer of pyrolytic graphite and pyrolytic boron nitride will reduce the temperature differential at a selected area on the crucible, electrically isolate the pyrolytic graphite layer from any surrounding resistance heater wires and reduce the possibility for carbon contamination of products being produced using the crucible.

FIG. 2 shows another embodiment of the invention of a duplex coated crucible except that the main body of crucible 12 has a thin inner layer of pyrolytic boron nitride 14 and a thicker outer layer of pyrolytic boron nitride 16. It is believed that the multi-walled crucibles are more flexible than conventional single-walled crucibles and exhibit improved thermal cycling characteristics and longer life. The duplex layers of pyrolytic graphite 18 and pyrolytic boron nitride 20 are shown on the external surface of crucible 12 near its open end. The duplex coated layers is also shown extended to cover the bottom surface 22 of flange 24 of crucible 12.

Figure 1:
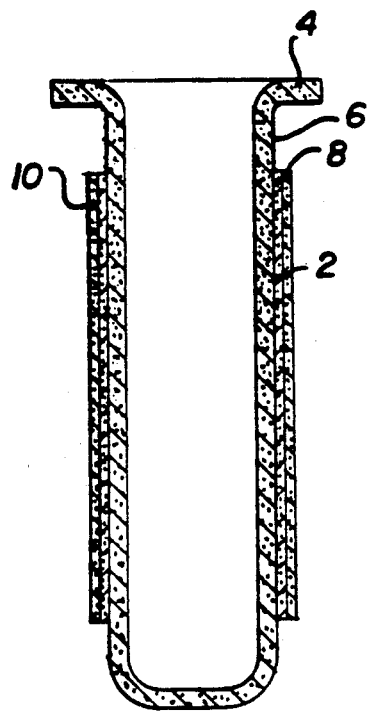
FIG. 1 is an elevational cross-sectional view of a single walled pyrolytic boron nitride evaporating crucible having a duplex coating on a selected area of the exterior surface of the crucible.
Figure 2:
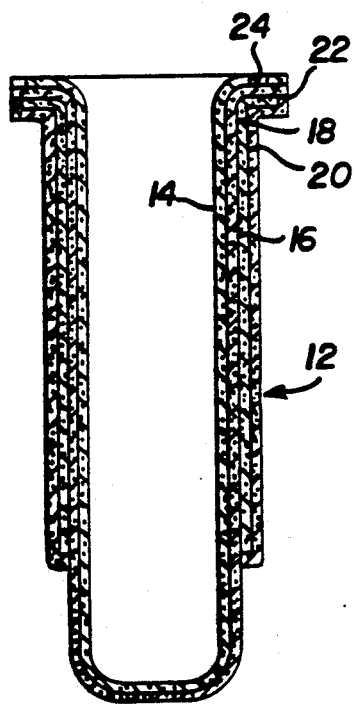
FIG. 2 is an elevational cross-sectional view of a multi-walled pyrolytic boron nitride evaporating crucible having a duplex coating on the exterior surface of the crucible proximate the open end of the crucible.

It is to be understood that although the present invention has been described with reference to particular details thereof, it is not intended that these details shall be construed as limiting the scope of this invention.

What is claimed:

1. A boron nitride crucible having a closed end, an open end, a length extending from the open end to the closed end; an internal surface and an external surface; wherein at least a portion of the external surface of the crucible has a duplex coating comprising an undercoat of pyrolytic graphite and a top coat of pyrolytic boron nitride completely superimposing the undercoat and wherein neither the undercoat nor the top coat is the structural member of the crucible.

2. The boron nitride crucible of claim 1 wherein the undercoat of pyrolytic graphite is from 0.001 to 0.1 inch thick.

3. The boron nitride crucible of claim 1 wherein the top coat of pyrolytic boron nitride is from 0.002 to 0.04 inch thick.

4. The boron nitride crucible of claim 1 wherein the undercoat of pyrolytic graphite is from 0.001 to 0.01 inch thick and the top coat of pyrolytic boron nitride is from 0.004 to 0.01 inch thick.

5. The boron nitride crucible of claim 1 wherein the duplex coating extends for said length of 10 to 80 percent of the length of the boron nitride crucible.

6. The boron nitride crucible of claim 1 wherein the crucible is a single walled boron nitride crucible.

7. The boron nitride crucible of claim 1 wherein the crucible is a multi-wall boron nitride crucible.

8. The boron nitride crucible of claim 1 wherein the duplex coating extends on the external surface from the open end of the crucible for a length of 10 to 80 percent of the length of the boron nitride crucible.

9. The boron nitride crucible of claim 8 wherein the undercoat of pyrolytic graphite is from 0.001 to 0.1 inch thick and the top coat of pyrolytic boron nitride is from 0.002 to 0.04 inch thick.

* * * * *